(12) United States Patent
Partlo et al.

(10) Patent No.: US 7,365,349 B2
(45) Date of Patent: Apr. 29, 2008

(54) EUV LIGHT SOURCE COLLECTOR LIFETIME IMPROVEMENTS

(75) Inventors: William N. Partlo, Poway, CA (US); Alexander I. Ershov, San Diego, CA (US); Igor V. Fomenkov, San Diego, CA (US); Oleh Khodykin, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 299 days.

(21) Appl. No.: 11/168,190

(22) Filed: Jun. 27, 2005

(65) Prior Publication Data
US 2007/0023705 A1  Feb. 1, 2007

(51) Int. Cl.
*H01J 35/20* (2006.01)
(52) U.S. Cl. ............... 250/504 R; 250/493.1; 378/119
(58) Field of Classification Search ............ 250/504 R, 250/492.2, 494.1, 493.1
See application file for complete search history.

(56) References Cited

U.S. PATENT DOCUMENTS

| | | | |
|---|---|---|---|
| 2,740,963 A | 4/1956 | Donovan | 342/34 |
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,009,391 A | 2/1977 | Janes et al. | 250/281 |
| 4,042,848 A | 8/1977 | Lee | 313/231.6 |
| 4,088,966 A | 5/1978 | Samis | 313/231.5 |

(Continued)

FOREIGN PATENT DOCUMENTS

JP  02-105478  4/1990

(Continued)

OTHER PUBLICATIONS

Andreev et al., Enhancement of Laser/EUV Conversion by Shaped Laser Pulse Interacting with Li-Contained Targets for EUV Litography, Proc. of SPIE 5196:128-136, (2004).

(Continued)

*Primary Examiner*—Robert Kim
*Assistant Examiner*—Johnnie L Smith, II
(74) *Attorney, Agent, or Firm*—William C. Cray

(57) ABSTRACT

An apparatus and method for cleaning a plasma source material compound from a plasma produced EUV light source collector optic which may comprise reacting the plasma source material compound with hydrogen to form a hydride of the plasma source material from the plasma source material contained in the plasma source material compound on the collector optic. The method may further comprise initiating the reacting by introducing hydrogen into a plasma formation chamber containing the collector optic, and may further comprise removing the hydride from the collector optic, e.g., by cleaning plasma action and/or plasma source material sputtering, or other means as may be determined to be effective. An apparatus and method of extending the useful life of a plasma produced EUV light source collector coating layer may comprise in situ replacement of the material of the coating layer by deposition of the coating layer material onto the coating layer.

24 Claims, 3 Drawing Sheets

U.S. PATENT DOCUMENTS

| | | | |
|---|---|---|---|
| 4,143,275 A | 3/1979 | Mallozzi et al. ............... 250/503 |
| 4,162,160 A | 7/1979 | Witter ............................ 75/246 |
| 4,203,393 A | 5/1980 | Giardini ........................... 123/30 |
| 4,223,279 A | 9/1980 | Bradford, Jr. et al. ....... 331/94.5 |
| 4,329,664 A | 5/1982 | Javan ............................ 359/276 |
| 4,364,342 A | 12/1982 | Asik ............................. 123/143 |
| 4,369,758 A | 1/1983 | Endo ............................. 123/620 |
| 4,455,658 A | 6/1984 | Sutte et al. ..................... 372/38 |
| 4,504,964 A | 3/1985 | Cartz et al. ................... 378/119 |
| 4,507,588 A | 3/1985 | Asmussen et al. ............. 315/39 |
| 4,534,035 A | 8/1985 | Long ............................... 372/85 |
| 4,536,884 A | 8/1985 | Weiss et al. .................. 378/119 |
| 4,538,291 A | 8/1985 | Iwamatsu ..................... 378/119 |
| 4,550,408 A | 10/1985 | Karning et al. ................ 372/58 |
| 4,561,406 A | 12/1985 | Ward ............................ 123/536 |
| 4,596,030 A | 6/1986 | Herziger et al. .............. 378/119 |
| 4,618,971 A | 10/1986 | Weiss et al. .................... 378/34 |
| 4,626,193 A | 12/1986 | Gann ............................... 431/71 |
| 4,633,492 A | 12/1986 | Weiss et al. .................. 378/119 |
| 4,635,282 A | 1/1987 | Okada et al. ................... 378/34 |
| 4,751,723 A | 6/1988 | Gupta et al. .................. 378/119 |
| 4,752,946 A | 6/1988 | Gupta et al. .................. 378/119 |
| 4,774,914 A | 10/1988 | Ward ............................ 123/162 |
| 4,837,794 A | 6/1989 | Riordan et al. ............... 378/119 |
| 4,891,820 A | 1/1990 | Rando et al. ................... 372/93 |
| 4,928,020 A | 5/1990 | Birx et al. ..................... 307/106 |
| 4,959,840 A | 9/1990 | Akins et al. .................... 372/57 |
| 5,005,180 A | 4/1991 | Edelman et al. ............... 372/57 |
| 5,022,033 A | 6/1991 | Hackell ........................... 372/25 |
| 5,023,884 A | 6/1991 | Akins et al. .................... 372/57 |
| 5,023,897 A | 6/1991 | Neff et al. ..................... 378/122 |
| 5,025,445 A | 6/1991 | Anderson et al. .............. 372/20 |
| 5,025,446 A | 6/1991 | Kuizenga ........................ 372/21 |
| 5,027,076 A | 6/1991 | Horsley et al. ............... 325/674 |
| 5,070,513 A | 12/1991 | Letardi ............................ 372/83 |
| 5,091,778 A | 2/1992 | Keeler ............................ 348/31 |
| 5,102,776 A | 4/1992 | Hammer et al. .............. 430/311 |
| 5,126,638 A | 6/1992 | Dethlefsen ................... 315/326 |
| 5,142,166 A | 8/1992 | Birx ............................... 307/419 |
| 5,142,543 A | 8/1992 | Wakabayashi et al. ........ 372/32 |
| 5,157,684 A | 10/1992 | Benda et al. .................... 372/95 |
| 5,175,755 A | 12/1992 | Kumakhov ..................... 378/34 |
| 5,181,135 A | 1/1993 | Keeler .......................... 398/104 |
| 5,189,678 A | 2/1993 | Ball et al. ....................... 372/28 |
| 5,313,481 A | 5/1994 | Cook et al. ..................... 372/37 |
| 5,315,611 A | 5/1994 | Ball et al. ....................... 372/56 |
| 5,319,695 A | 6/1994 | Itoh et al. ...................... 378/84 |
| 5,359,620 A | 10/1994 | Akins ............................. 372/58 |
| 5,411,224 A | 5/1995 | Dearman et al. ............. 244/53 |
| 5,425,922 A | 6/1995 | Kawaguchi ................... 422/186 |
| 5,448,580 A | 9/1995 | Birx et al. ...................... 372/38 |
| 5,450,436 A | 9/1995 | Mizoguchi et al. ............ 372/59 |
| 5,463,650 A | 10/1995 | Ito et al. ......................... 372/57 |
| 5,471,965 A | 12/1995 | Kapich .......................... 123/565 |
| 5,504,795 A | 4/1996 | McGeoch ..................... 378/119 |
| 5,563,555 A | 10/1996 | Nalos et al. ..................... 331/81 |
| 5,729,562 A | 3/1998 | Birx et al. ....................... 372/38 |
| 5,763,930 A | 6/1998 | Partlo ........................... 250/504 |
| 5,852,621 A | 12/1998 | Sandstrom ..................... 372/25 |
| 5,856,991 A | 1/1999 | Ershov ........................... 372/57 |
| 5,863,017 A | 1/1999 | Larson et al. ............... 248/176.1 |
| 5,866,871 A | 2/1999 | Birx .............................. 219/121 |
| 5,933,271 A | 8/1999 | Waarts et al. .............. 359/341.31 |
| 5,936,988 A | 8/1999 | Partlo et al. .................... 372/38 |
| 5,953,360 A | 9/1999 | Vitruk et al. .................... 372/87 |
| 5,963,616 A | 10/1999 | Silfvast et al. ............... 378/122 |
| 5,978,394 A | 11/1999 | Newman et al. .............. 372/32 |
| 5,991,324 A | 11/1999 | Knowles et al. ............... 372/57 |
| 6,005,879 A | 12/1999 | Sandstrom et al. ............ 372/25 |
| 6,016,323 A | 1/2000 | Kafka et al. .................... 372/38 |
| 6,016,325 A | 1/2000 | Ness et al. ...................... 372/38 |
| 6,018,537 A | 1/2000 | Hofmann et al. .............. 372/25 |
| 6,028,880 A | 2/2000 | Carlesi et al. .................. 372/58 |
| 6,031,241 A | 2/2000 | Silfvast et al. ................ 250/504 |
| 6,031,598 A | 2/2000 | Tichenor et al. .............. 355/67 |
| 6,039,850 A | 3/2000 | Schulz ....................... 204/192.15 |
| 6,051,841 A | 4/2000 | Partlo et al. .................. 250/504 |
| 6,064,072 A | 5/2000 | Partlo et al. .................. 250/504 |
| 6,067,306 A | 5/2000 | Sandstrom et al. ........ 372/38.01 |
| 6,067,311 A | 5/2000 | Morton et al. ................. 372/57 |
| 6,094,448 A | 7/2000 | Fomenkov et al. .......... 372/102 |
| 6,104,735 A | 8/2000 | Webb ............................. 372/37 |
| 6,128,323 A | 10/2000 | Myers et al. ................ 372/38.1 |
| 6,151,346 A | 11/2000 | Partlo et al. .................... 372/38 |
| 6,151,349 A | 11/2000 | Gong et al. ..................... 372/58 |
| 6,164,116 A | 12/2000 | Rice et al. ..................... 73/1.72 |
| 6,172,324 B1 | 1/2001 | Birx ........................... 219/121.57 |
| 6,181,719 B1 | 1/2001 | Sukhman et al. ........... 372/38.1 |
| 6,192,064 B1 | 2/2001 | Algots et al. ................... 372/99 |
| 6,195,272 B1 | 2/2001 | Pascente ......................... 363/21 |
| 6,208,674 B1 | 3/2001 | Webb et al. .................... 372/57 |
| 6,208,675 B1 | 3/2001 | Webb ............................. 372/58 |
| 6,219,368 B1 | 4/2001 | Govorkov ....................... 372/59 |
| 6,240,117 B1 | 5/2001 | Gong et al. ..................... 372/58 |
| 6,281,471 B1 | 8/2001 | Smart ....................... 219/121.62 |
| 6,285,743 B1 | 9/2001 | Kondo et al. ................ 378/119 |
| 6,307,913 B1 | 10/2001 | Foster et al. ................... 378/34 |
| 6,359,922 B1 | 3/2002 | Partlo et al. .................... 372/58 |
| 6,370,174 B1 | 4/2002 | Onkels et al. .............. 372/38.04 |
| 6,377,651 B1 | 4/2002 | Richardson et al. ........... 378/34 |
| 6,381,257 B1 | 4/2002 | Ershov et al. .................. 372/57 |
| 6,392,743 B1 | 5/2002 | Zambon et al. ................ 355/69 |
| 6,396,900 B1 | 5/2002 | Barbee, Jr. et al. ............ 378/84 |
| 6,404,784 B2 | 6/2002 | Komine ............................ 372/9 |
| 6,414,979 B2 | 7/2002 | Ujazdowski et al. .......... 372/87 |
| 6,442,181 B1 | 8/2002 | Oliver et al. ................... 372/25 |
| 6,452,194 B2 | 9/2002 | Bijkerk et al. .............. 250/492.2 |
| 6,452,199 B1 | 9/2002 | Partlo et al. .................. 250/504 |
| 6,466,602 B1 | 10/2002 | Fleurov et al. ................. 372/87 |
| 6,477,193 B2 | 11/2002 | Oliver et al. ................... 372/58 |
| 6,493,374 B1 | 12/2002 | Fomenkov et al. .......... 372/102 |
| 6,493,423 B1 | 12/2002 | Bisschops ..................... 378/119 |
| 6,529,531 B1 | 3/2003 | Everage et al. ................ 372/20 |
| 6,532,247 B2 | 3/2003 | Spangler et al. ............... 372/61 |
| 6,535,531 B1 | 3/2003 | Smith et al. .................... 372/25 |
| 6,538,737 B2 | 3/2003 | Sandstrom et al. ........... 356/334 |
| RE38,054 E | 4/2003 | Hofmann et al. .............. 372/25 |
| 6,549,551 B2 | 4/2003 | Ness et al. ................. 372/38.07 |
| 6,553,049 B1 | 4/2003 | Besaucele et al. ............. 372/57 |
| 6,566,667 B1 | 5/2003 | Partlo et al. .................. 250/504 |
| 6,566,668 B2 | 5/2003 | Rauch et al. ................. 250/504 |
| 6,567,450 B2 | 5/2003 | Myers et al. ................... 372/55 |
| 6,567,499 B2 | 5/2003 | McGeoch ..................... 378/119 |
| 6,576,912 B2 | 6/2003 | Visser et al. ............... 250/492.2 |
| 6,584,132 B2 | 6/2003 | Morton ........................... 372/57 |
| 6,586,757 B2 | 7/2003 | Melnychuk et al. ......... 250/504 |
| 6,621,846 B1 | 9/2003 | Sandstrom et al. ............ 372/57 |
| 6,625,191 B2 | 9/2003 | Knowles et al. ............... 372/55 |
| 6,635,844 B2 | 10/2003 | Yu ............................ 219/121.68 |
| 6,664,554 B2 * | 12/2003 | Klebanoff et al. ......... 250/505.1 |
| 6,671,294 B2 | 12/2003 | Kroyan et al. ................. 372/20 |
| 6,714,624 B2 | 3/2004 | Fornaciari et al. ........... 378/119 |
| 6,721,340 B1 | 4/2004 | Fomenkov et al. ............ 372/25 |
| 6,757,316 B2 | 6/2004 | Newman et al. ............... 372/57 |
| 6,765,945 B2 | 7/2004 | Sandstrom et al. ............ 372/57 |
| 6,782,031 B1 | 8/2004 | Hofmann et al. .............. 372/90 |
| 6,795,474 B2 | 9/2004 | Partlo et al. .................... 372/57 |
| 6,815,700 B2 | 11/2004 | Melnychuk et al. ..... 250/504 R |
| 6,968,850 B2 * | 11/2005 | Chan et al. ..................... 134/1.1 |
| 7,196,342 B2 * | 3/2007 | Ershov et al. ............ 250/504 R |
| 2001/0055364 A1 | 12/2001 | Kandaka et al. .............. 378/119 |
| 2002/0006149 A1 | 1/2002 | Spangler et al. ............... 372/61 |
| 2002/0009176 A1 | 1/2002 | Ameniya et al. ............... 378/34 |
| 2002/0012376 A1 | 1/2002 | Das et al. ....................... 372/58 |

| | | | |
|---|---|---|---|
| 2002/0014598 A1 | 2/2002 | Melnychuk et al. | 250/504 R |
| 2002/0014599 A1 | 2/2002 | Rauch et al. | 250/504 R |
| 2002/0021728 A1 | 2/2002 | Newman et al. | 375/55 |
| 2002/0048288 A1 | 4/2002 | Kroyan et al. | 372/20 |
| 2002/0100882 A1 | 8/2002 | Partlo et al. | 250/504 |
| 2002/0101589 A1 | 8/2002 | Sandstrom et al. | 356/334 |
| 2002/0105994 A1 | 8/2002 | Partlo et al. | 372/57 |
| 2002/0114370 A1 | 8/2002 | Onkels et al. | 372/55 |
| 2002/0141536 A1 | 10/2002 | Richardson | 378/119 |
| 2002/0154668 A1 | 10/2002 | Knowles et al. | 372/55 |
| 2002/0162973 A1 | 11/2002 | Cordingley et al. | 250/492.2 |
| 2002/0163313 A1 | 11/2002 | Ness et al. | 315/111.01 |
| 2002/0168049 A1 | 11/2002 | Schriever et al. | 378/119 |
| 2003/0006383 A1 | 1/2003 | Melynchuk et al. | 250/504 |
| 2003/0068012 A1 | 4/2003 | Ahmad et al. | 378/119 |
| 2003/0219056 A1 | 11/2003 | Yager et al. | 372/57 |
| 2004/0047385 A1 | 3/2004 | Knowles et al. | 372/55 |
| 2004/0160155 A1* | 8/2004 | Partlo et al. | 313/231.31 |
| 2005/0122593 A1* | 6/2005 | Johnson | 359/650 |
| 2005/0174576 A1 | 8/2005 | Rao et al. | 356/454 |
| 2005/0230645 A1* | 10/2005 | Melnychuk et al. | 250/504 R |
| 2007/0023711 A1* | 2/2007 | Fomenkov et al. | 250/504 R |

FOREIGN PATENT DOCUMENTS

| | | |
|---|---|---|
| JP | 03-173189 | 7/1991 |
| JP | 06-053594 | 2/1994 |
| JP | 09-219555 | 8/1997 |
| JP | 2000-058944 | 2/2000 |

OTHER PUBLICATIONS

Apruzese, "X-Ray Laser Research Using Z Pinches," Am. Inst. Of Phys. 399-403, (1994).

Bollanti et al., "Compact Three Electrodes Excimer Laser IANUS for a POPA Optical System," SPIE Proc. (2206) 144-153, (1994).

Bollanti et al., "Ianus, the Three-Electrode Excimer Laser," App. Phys. B (Lasers & Optics) 66(4):401-406, (1998).

Braun et al., "Multi-Component EUV Multilayer Mirrors," Proc. SPIE, 5037:2-13 (2003).

Choi et al., "A $10^{13}$ A/s High Energy Density Micro Discharge Radiation Source," B. Radiation Characteristics, p. 287-290.

Choi et al., "Fast Pulsed Hollow Cathode Capillary Discharge Device," Rev. of Sci. Instrum. 69(9):3118-3122 (1998).

Choi et al., "Temporal Development of Hard and Soft X-Ray Emission from a Gas-Puff Z Pinch," Rev. Sci. Instrum. 57(8), pp. 2162-2164 (Aug. 1986).

Coutts et al., High Average Power Blue Generation from a Copper Vapour Laser Pumped Titanium Sapphire Laser, Journal of Modern Optics, vol. 45, No. 6, p. 1185-1197 (1998).

Feigl et al., "Heat Resistance of EUV Multilayer Mirrors for Long-Time Applications," Microelectric Engineering, 57-58:3-8, (2001).

Fomenkov et al., "Characterization of a 13.5nm Source for EUV Lithography based on a Dense Plasma Focus and Lithium Emission," Sematech Intl. Workshop on EUV Lithography (Oct. 1999).

Giordano et al., "Magnetic Pulse Compressor for Prepulse Discharge in Spiker-Sustainer Excitati Technique for XeCl Lasers," Rev. Sci. Instrum 65(8), pp. 2475-2481 (Aug. 1994).

Hansson et al., "Xenon Liquid Laser-Plasma Source for EUV Lithography," Emerging Lithographic Technologies IV, Proc. of SPIE, vol. 3997:729-732 (2000).

Jahn, Physics of Electric Propulsion, McGraw-Hill Book Company, (Series in Missile and Space U.S.A.), Chap. 9. "Unsteady Electromagnetic Acceleration," p. 257 (1968).

Kato, "Electrode Lifetimes in a Plasma Focus Soft X-Ray Source," J. Appl. Phys. (33) Pt. 1 No. 8:4742-4744 (1991).

Kato et al., "Plasma Focus X-Ray Source for Lithography," Am. Vac. Sci. Tech. B. 6(1): 195-198 (1988).

Lebert et al., "Soft X-Ray Emission of Laser-Produced Plasmas Using a Low-Debris Cryogenic Nitrogen Target," J. App. Phys., 84(6):3419-3421 (1998).

Lebert et al., "A Gas Discharge Based Radiation Source for EUV-Lithography," Intl. Conf. Micro and Nano-Engineering 98 (Sep. 22-24, 1998) Leuven, Belgium.

Lebert et al., "Investigation of Pinch Plasmas with Plasma Parameters Promising ASE," Inst. Phys. Conf. Ser. No. 125: Section 9, pp. 411-415 (1992) Schiersee, Germany.

Lebert et al., "Comparison of Laser Produced and Gas Discharge Based EUV Sources for Different Applications," Intl. Conf. Micro- and Nano-Engineering 98 (Sep. 22-24, 1998) Leuven Belgium.

Lee, "Production of Dense Plasmas in Hypocyloidal Pinch apparatus," The Phys. of Fluids, 20 (2):313-321 (1977).

Lewis, "Status of Collision-Pumped X-Ray Lasers," Am. Inst. Phys. pp. 9-16 (1994).

Lowe, "Gas Plasmas Yield X-Rays for Lithography," Electronics, pp. 40-41 (Jan. 27, 1982).

Malmqvist et al., "Liquid-Jet Target for Laser-Plasma Soft X-Ray Generation," Am. Inst. Phys. 67(12):4150-4153 (1996).

Maruyama et al., "Characteristics of High-Power Excimer Laser Master Oscillator Power amplifier System for Dye Laser Pumping", Optics Communications, vol. 87, No. 3, pp. 105-108 (1992).

Mather, "Formation of a High-Density Deuterium Plasma Focus," The Physics of Fluids, 8(2), 366-377 (Feb. 1965).

Mather et al., "Stability of the Dense Plasma Focus," Phys. of Fluids, 12(11):2343-2347 (1969).

Matthews and Cooper, "Plasma Sources for X-Ray Lithography," SPIE, 333, Submicron Lithography, pp. 136-139 (1982).

Mayo et al., "A Magnetized Coaxial Source Facility for the Generation of Energetic Plasma Flows," Sci. Technol. vol. 4:pp. 47-55 (1994).

Mayo et al., "Initial Results on High Enthalphy Plasma Generation in a Magnetized Coaxial Source," Fusion Tech. vol. 26:1221-1225 (1994).

Nilsen et al., "Analysis of Resonantly Photopumped Na-Ne X-Ray-Laser Scheme," Am. Phys. Soc. 44(7):4591-4597 (1991).

Orme et al., "Electrostatic Charging and Deflection of Nonconventional Droplet Streams Formed from Capillary Stream Breakup," Physics of Fluids, 12(9):2224-2235, (Sep. 2000).

Orme et al., "Charged Molten Metal Droplet Deposition as a Direct Write Technology", MRS 2000 Spring Meeting, San Francisco (Apr. 2000).

Pant et al., "Behavior of Expanding Laser Produced Plasma in a Magnetic Field," Physica Sripta, T75:104-111, (1998).

Partlo et al., "EUV (13.5 nm) Light Generation Using a Dense Plasma Focus Device," SPIE Proc. on Emerging Lithographic Technologies III, vol. 3676, 846-858 (Mar. 1999).

Pearlman et al., "X-Ray Lithography Using a Pulsed Plasma Source," J. Vac. Sci. Technol., pp. 1190-1193 (Nov./Dec. 1981).

Porter et al., "Demonstration of Population Inversion by Resonant Photopumping in a Neon Gas Cell Irradiated by a Sodium Z Pinch," Phys. Rev. Let., 68(6);796-799, (Feb. 1992).

Price, "X-Ray Microscopy Using Grazing Incidence Reflection Optics," Am. Inst. Phys., pp. 189-199, (1981).

Qi et al., "Fluorescence in Mg IX Emission at 48.340 Å from Mg Pinch Plasmas Photopumped by Al XI Line Radiation at 48.338 Å," Them Am. Phys. Soc., 47(3):2253-2263 (Mar. 1993).

Scheuer et al., "A Magnetically-Nozzled, Quasi-Steady, Multimegawatt, Coaxial Plasma Thruster," IEEE: Transactions on Plasma Science, 22(6) (Dec. 1994).

Schriever et al., "Laser-Produced Lithium Plasma as a Narrow-Band Extended Ultraviolet Radiation Source for Photoelectron Spectroscopy," App. Optics, 37(7):1243-1248, (Mar. 1998).

Schriever et al., "Narrowband Laser Produced Extreme Ultraviolet Sources Adapted to Silicon/Molybdenum Multilayer Optics," J. of App. Phys., 83(9):4566-4571, (May 1998).

Shiloh et al., "Z Pinch of a Gas Jet," Physical Review Lett., 40(8), pp. 515-518 (Feb. 20, 1978).

Silfvast et al., "High-Power Plasma Discharge Source at 13.5 nm and 11.4 nm for EUV Lithography," SPIE, vol. 3676:272-275, (Mar. 1999).

Silfvast et al., Lithium Hydride Capillary Discharge Creates X-Ray Plasma at 13.5 Nanometers, Laser Focus World p. 13 (Mar. 1997).

Stallings et al., "Imploding Argon Plasma Experiments," Appl., Phys. Lett. 35(7), pp. 524-536 (Oct. 1, 1979).

Tada et al., "1-pm Spectrally Narrowed Compact ArF Excimer Laser for Microlithography", Laser and Electro-Optics, CLEO '96, CThG4, p. 374 (1996).

Tillack et al., "Magnetic Confinement of an Expanding Laser-Produced Plasma," UC San Diego, Center for Energy Research, UCSD Report & Abramoya—Tornado Trap.

Wilhein et al., "A Slit Grating Spectrograph for Quantitative Soft X-Ray Spectroscopy," Am. Inst. Of Phys. Rev. of Sci. Instrum., 70(3):1694-1699, (Mar. 1999).

Wu et al., "The Vacuum Spark and Spherical Pinch X-Ray/EUV Point Sources," SPIE, Conf. On Emerging Tech. III, Santa Clara, CA, vol. 3676:410-420, (Mar. 1999).

Yusheng et al., "Recent Progress of "Heaven-One" High Power KrF Excimer Laser Syste", Laser and Electro-Optics, CLEO/Pacific Rim '99, vol. 2, p. 302-303 (1999).

Zombeck, "Astrohysical Observations with High Resolution X-Ray Telescope," Am. Inst. Of Phys. pp. 200-209, (1981).

* cited by examiner

EUV LIGHT SOURCE COLLECTOR LIFETIME IMPROVEMENTS

CROSS-REFERENCE TO RELATED APPLICATIONS

The present application is related to Attorney Docket No. 2002-0049-01, entitled PLASMA FOCUS LIGHT SOURCE WITH DEBRIS SHIELD, Ser. No. 60/422,808, filed on Oct. 31, 2002, currently Attorney Docket No. 2002-0030-01, and Attorney Docket No. 2003-0083-01, entitled COLLECTOR FOR EUV LIGHT SOURCE, Ser. No. 10/798,740, filed on Mar. 10, 2004; and Attorney Docket No. 2003-0099-01, entitled DISCHARGE PRODUCED PLASMA EUV LIGHT SOURCE, Ser. No. 10/742,233, filed on Dec. 18, 2003; and Ser. No. 10/803526, entitled A HIGH REPETITION RATE LASER PRODUCED PLASMA EUV LIGHT SOURCE, filed on Mar. 17, 2004, Attorney Docket No. 2003-0125-01; and Attorney Docket No. 2003-0132-01, entitled A DENSE-PLASMA FOCUS RADIATION SOURCE, Ser. No. 10/442,544, filed on May 21, 2003, the disclosure of each of which is hereby incorporated by reference.

FIELD OF THE INVENTION

The present invention related to EUV light source, e.g., laser produced plasma ("LPP") or discharge produced plasma ("DPP") debris mitigation, e.g., for purposes of prolonging the optical life of optical elements within the plasma production chamber, e.g., the collector.

BACKGROUND OF THE INVENTION

S. Booyoog, et al., "Atomic layer deposition of transition metals," Nature Materials, Nature Publishing group, Vol. 2 (November 2003), www. nature. com/naturematerials ("Booyoog"), the disclosure of which is hereby incorporated by reference, discloses that atomic layer deposition (ALD) is a process for depositing highly uniform and conformal thin films by alternating exposures of a surface to vapors of two chemical reactants. ALD processes have been successfully demonstrated for many metal compounds, but for only very few pure metals. The article discusses processes for the ALD of transition metals including copper, cobalt, iron and nickel. Homoleptic N,N'-dialkylacetamidinato metal compounds and molecular hydrogen gas are disclosed to be used as the reactants. Their surface reactions are disclosed to be complementary and self-limiting, thus providing highly uniform thicknesses and conformal coating of long, narrow holes. The authors also propose that these ALD layers grow by a hydrogenation mechanism that should also operate during the ALD of many other metals. The use of water vapor in place of hydrogen gas is disclosed to give a highly uniform, conformal film of metal oxides, including lanthanum oxide.

SUMMARY OF THE INVENTION

According to aspects of an embodiment of the present invention an apparatus and method for cleaning a plasma source material compound from a plasma produced EUV light source collector optic is disclosed which may comprise reacting the plasma source material compound with hydrogen to form a hydride of the plasma source material from the plasma source material contained in the plasma source material compound on the collector optic. The method may further comprise initiating the reacting by introducing hydrogen into a plasma formation chamber containing the collector optic, and may further comprise removing the hydride from the collector optic, e.g., by cleaning plasma action and/or plasma source material sputtering, or other means as may be determined to be effective. The plasma source material may comprise lithium and the plasma source material compound may comprise a compound of lithium and oxygen and/or compounds of lithium and carbon. According to aspects of an embodiment of the present invention an apparatus and method of extending the useful life of a plasma produced EUV light source collector coating layer comprising in situ replacement of the material of the coating layer by deposition of the coating layer material onto the coating layer. The deposition process may have a saturation limit such that the process is non-sensitive to exact proportions and/or may be complementary such that cycles are repeatable. The he material of the coating layer may comprise ruthenium. The deposition may be carried out by atomic layer deposition.

DETAILED DESCRIPTION OF PREFERRED EMBODIMENTS

Figure 1:
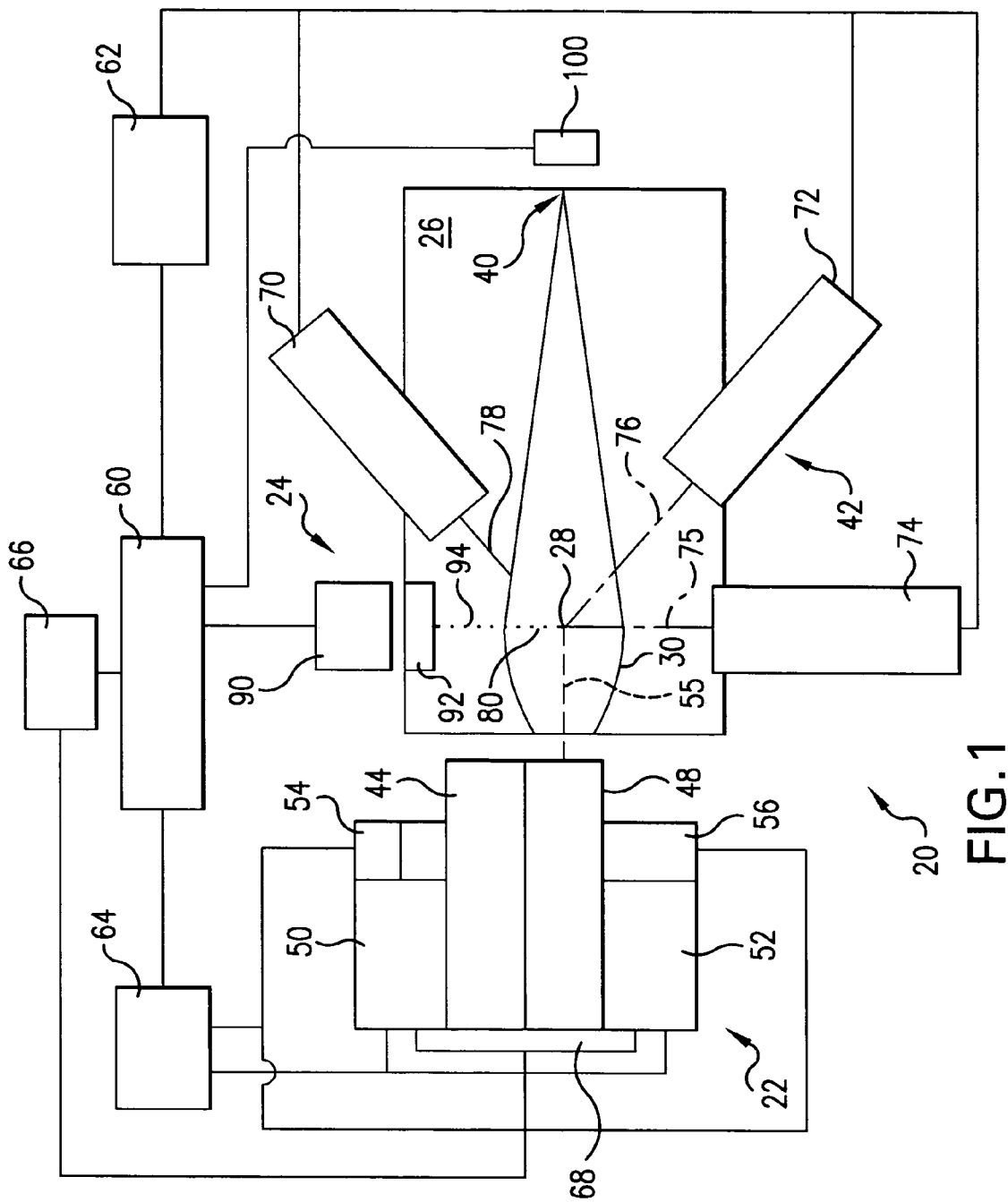
FIG. 1 shows a schematic block diagram illustration of a laser produced plasma ("LPP") extreme ultraviolet ("EUV") light source in which aspects of embodiments of the present invention are useful.

Turning now to FIG. 1 there is shown a schematic view of an overall broad conception for an EUV light source, e.g., a laser produced plasma EUV light source 20 according to an aspect of the present invention. The light source 20 may contain a pulsed laser system 22, e.g., a gas discharge laser, e.g., an excimer gas discharge laser, e.g., a KrF or ArF laser operating at high power and high pulse repetition rate and may be a MOPA configured laser system, e.g., as shown in U.S. Pat. Nos. 6,625,191, 6,549,551, and 6,567,450. The laser may also be, e.g., a solid state laser, e.g., a YAG laser. The light source 20 may also include a target delivery system 24, e.g., delivering targets in the form of liquid droplets, solid particles or solid particles contained within liquid droplets. The targets may be delivered by the target delivery system 24, e.g., into the interior of a chamber 26 to an irradiation site 28, otherwise known as an ignition site or the sight of the fire ball. Embodiments of the target delivery system 24 are described in more detail below.

Laser pulses delivered from the pulsed laser system 22 along a laser optical axis 55 through a window (not shown) in the chamber 26 to the irradiation site, suitably focused, as discussed in more detail below in coordination with the arrival of a target produced by the target delivery system 24 to create an ignition or fire ball that forms an x-ray (or soft x-ray (EUV) releasing plasma, having certain characteristics, including wavelength of the x-ray light produced, type and amount of debris released from the plasma during or after ignition, according to the material of the target.

The light source may also include a collector 30, e.g., a reflector, e.g., in the form of a truncated ellipse, with an aperture for the laser light to enter to the ignition site 28. Embodiments of the collector system are described in more detail below. The collector 30 may be, e.g., an elliptical mirror that has a first focus at the ignition site 28 and a second focus at the so-called intermediate point 40 (also called the intermediate focus 40) where the EUV light is output from the light source and input to, e.g., an integrated circuit lithography tool (not shown). The system 20 may also include a target position detection system 42. The pulsed system 22 may include, e.g., a master oscillator-power amplifier ("MOPA") configured dual chambered gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The pulse power system may include power for creating laser output from, e.g., a YAG laser. The system 20 may also include an EUV light source controller system 60, which may also include, e.g., a target position detection feedback system 62 and a firing control system 65, along with, e.g., a laser beam positioning system 66.

The target position detection system may include a plurality of droplet imagers 70, 72 and 74 that provide input relative to the position of a target droplet, e.g., relative to the ignition site and provide these inputs to the target position detection feedback system, which can, e.g., compute a target position and trajectory, from which a target error cam be computed, if not on a droplet by droplet basis then on average, which is then provided as an input to the system controller 60, which can, e.g., provide a laser position and direction correction signal, e.g., to the laser beam positioning system 66 that the laser beam positioning system can use, e.g., to control the position and direction of he laser position and direction changer 68, e.g., to change the focus point of the laser beam to a different ignition point 28.

The imager 72 may, e.g., be aimed along an imaging line 75, e.g., aligned with a desired trajectory path of a target droplet 94 from the target delivery mechanism 92 to the desired ignition site 28 and the imagers 74 and 76 may, e.g., be aimed along intersecting imaging lines 76 and 78 that intersect, e.g., alone the desired trajectory path at some point 80 along the path before the desired ignition site 28.

The target delivery control system 90, in response to a signal from the system controller 60 may, e.g., modify the release point of the target droplets 94 as released by the target delivery mechanism 92 to correct for errors in the target droplets arriving at the desired ignition site 28.

An EUV light source detector 100 at or near the intermediate focus 40 may also provide feedback to the system controller 60 that can be, e.g., indicative of the errors in such things as the timing and focus of the laser pulses to properly intercept the target droplets in the right place and time for effective and efficient LPP EUV light production.

Figure 2:
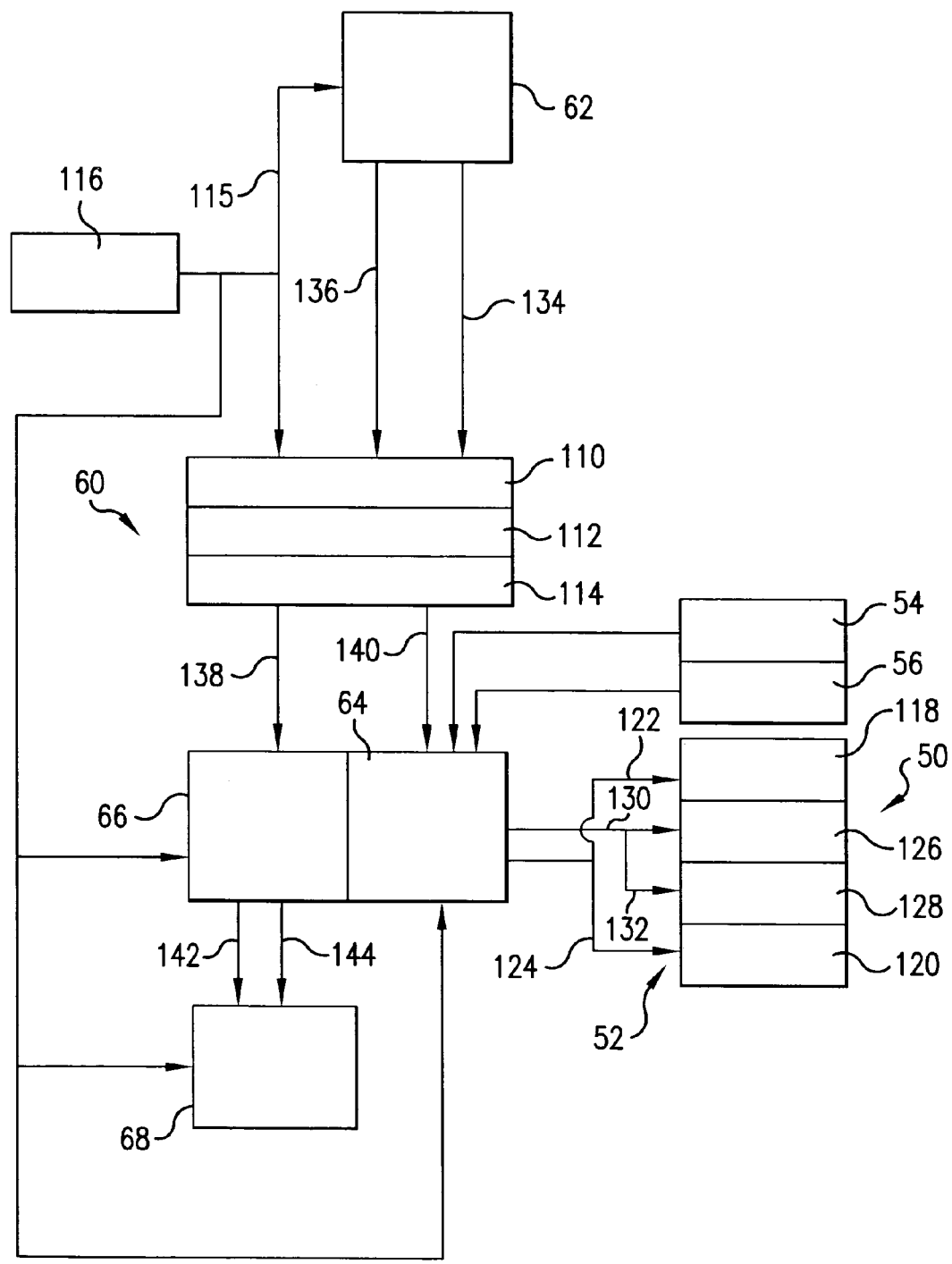
FIG. 2 shows a schematic block diagram illustration of an exemplary control system useful with the EUV light source of FIG. 1.

Turning now to FIG. 2 there is shown schematically further details of a controller system 60 and the associated monitoring and control systems, 62, 64 and 66 as shown in FIG. 1. The controller may receive, e.g., a plurality of position signal 134, 136 a trajectory signal 136 from the target position detection feedback system, e.g., correlated to a system clock signal provided by a system clock 116 to the system components over a clock bus 115. The controller 60 may have a pre-arrival tracking and timing system 110 which can, e.g., compute the actual position of the target at some point in system time and a target trajectory computation system 112, which can, e.g., compute the actual trajectory of a target drop at some system time, and an irradiation site temporal and spatial error computation system 114, that can, e.g., compute a temporal and a spatial error signal compared to some desired point in space and time for ignition to occur.

The controller 60 may then, e.g., provide the temporal error signal 140 to the firing control system 64 and the spatial error signal 138 to the laser beam positioning system 66. The firing control system may compute and provide to a resonance charger portion 118 of the oscillator laser 44 magnetic reactor-switched pulse compression and timing circuit 50 a resonant charger initiation signal 122 and may provide, e.g., to a resonance charger portion 120 of the PA magnetic reactor-switched pulse compression and timing circuit 52 a resonant charger initiation signal, which may both be the same signal, and may provide to a compression circuit portion 126 of the oscillator laser 44 magnetic reactor-switched pulse compression and timing circuit 50 a trigger signal 130 and to a compression circuit portion 128 of the amplifier laser system 48 magnetic reactor-switched pulse compression and timing circuit 52 a trigger signal 132, which may not be the same signal and may be computed in part from the temporal error signal 140 and from inputs from the light out detection apparatus 54 and 56, respectively for the oscillator laser system and the amplifier laser system.

The spatial error signal may be provided to the laser beam position and direction control system 66, which may provide, e.g., a firing point signal and a line of sight signal to the laser bean positioner which may, e.g. position the laser to change the focus point for the ignition site 28 by changing either or both of the position of the output of the laser system amplifier laser 48 at time of fire and the aiming direction of the laser output beam.

Figure 3:
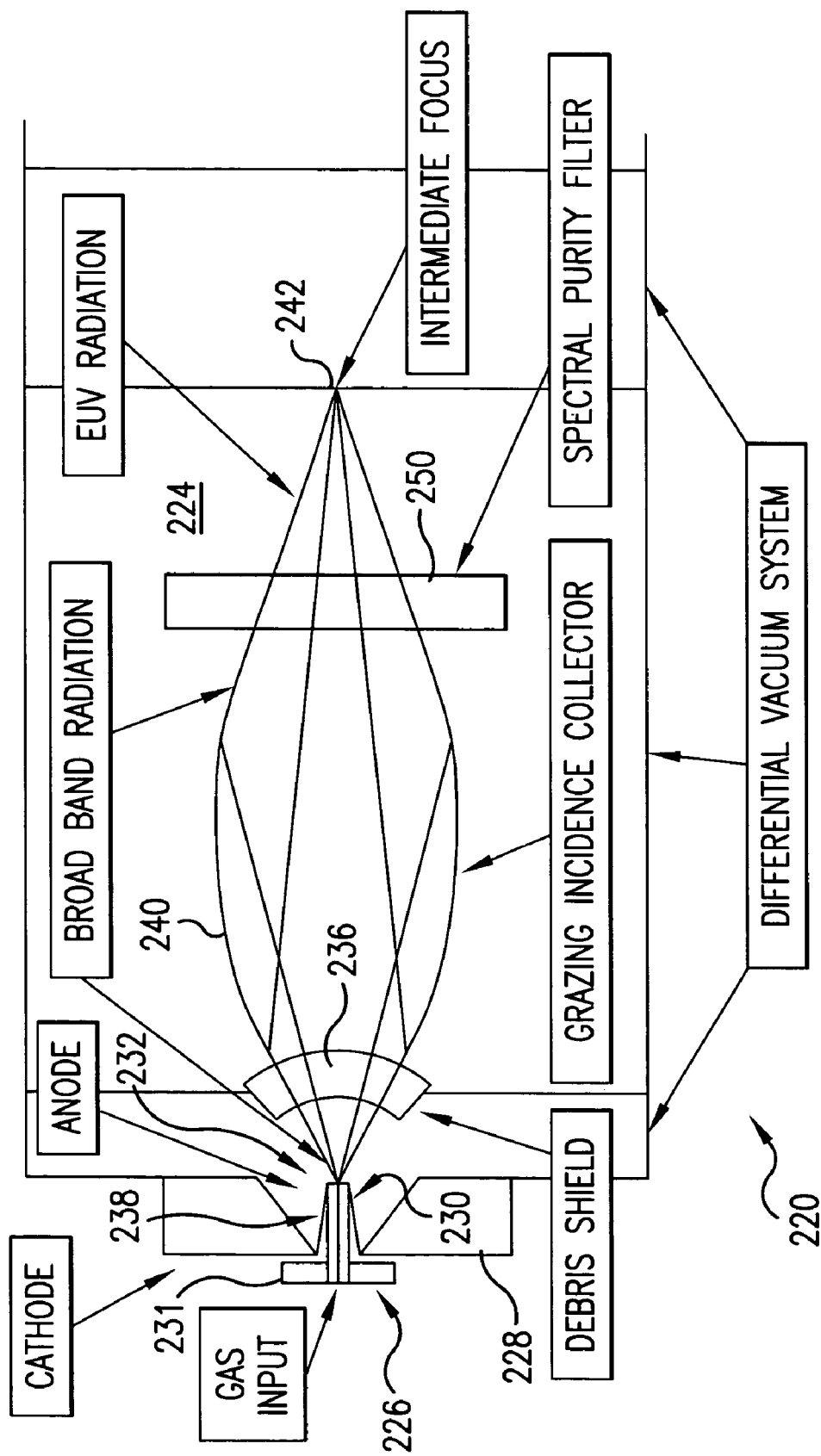
FIG. 3 shows a schematic illustration of a discharge produced plasma ("DPP") EUV light source in which aspects of embodiments of the present invention may be useful.

Turning now to FIG. 3 there is shown a discharge produced plasma ("DPP") EUV and soft-x-ray light source 220 according to an embodiment of the present invention. The EUV light source may include, e.g., a housing 222, defining a discharge chamber 224. Attached, e.g., through a sealed opening in one wall of the chamber 222 may be, e.g., a pair of electrodes 226, which may include, e.g., generally cylindrical electrodes including, e.g., an outer electrode 228, which may be, e.g., the cathode, and an inner electrode 230, which may be, e.g., an anode or vice-versa, but for purposes of this disclosure the former designations will be used. The inner electrode 230 may be insulated from the outer electrode 228, e.g., by an insulator (not shown), and together, when supplied by a very high voltage and with a very fast rise time pulse of electrical energy, e.g., from a solid state pulse power module (not shown), may produce a discharge between the electrodes 228, 230, e.g., through an ionized gas, e.g., comprising helium. The discharge may be facilitated in its initiation by a preionizer (not shown). The discharge may, e.g., initially form a magnetic field that extends generally radially from the inner electrode near the insulator (not shown) and preionizer (not shown) and then extend more axially as it transmits along the outer surface 238 of the inner electrode (anode) 230. The axially extending magnetic field 248, forms a high density plasma pinch 232 confined briefly by the magnetic field 248 comprising a source material, e.g., xenon, e.g., delivered to the pinch site 250 through a source delivery tube (not shown) and, e.g., delivered into a center electrode (anode) tip depression 234 in the tip of the center electrode 230.

Light emitted from the plasma pinch may, e.g., be collected by, e.g., a grazing angle of incidence collector 240 after passing through, e.g., a debris shield 236 that can, e.g., trap debris, e.g., ionized xenon particles emitted from the plasma during the light generation process or electrode material, e.g., tungsten debris from the electrodes, and potentially damaging, e.g., to the reflecting surface(s) in the collector 240. The light focused by the collector 240, which may be, e.g., a single curved surface reflecting rays of the EUV light by grazing angle of incidence reflection to a focal point or plane called the intermediate focus 242, may also pass through, e.g., a spectral purity filter 244 operative to filter out substantially all of the light except at, e.g., 13.5 nm and a relatively narrow bandwidth around 13.5 nm.

An aspect of an embodiment of the present invention contemplates compensating for thermal loads on the collector 240 in order to produce more consistent high EUV energy delivered to the intermediate focus 242. Indications are that customers for EUV light sources will expect in the neighborhood of at least ten thousand hours of operation of the collector 30, 240 optics as a lifetime prior to replacement. With a plasma source material that is highly reactive, e.g., lithium, e.g., in molten droplet form, it has been suggested to keep the collector 30, 240 clean it should be kept at elevated temperature to evaporate off all of the incoming lithium. The temperature should high enough, e.g., that an evaporation rate is higher than incoming flux of lithium, e.g., 350-450° C., as has been discussed in at least one of the above referenced co-pending patent applications.

Certain plasma source materials such as lithium which can be very reactive materials, can react with almost any contaminant on a collector 30, 240 surface or elsewhere within the plasma initiation chamber 26 and creates lithium compounds on the collector 30, 240 surface or which can wind up on the collector 30, 240 surface. The melting temperature of many of these compounds and especially almost all lithium compounds is significantly higher than the melting temperature of the plasma source material itself, e.g., the lithium melting temperature. To evaporate, e.g., lithium compounds from the collector 30, 240 the collector 30, 240 should be kept at very high temperature, e.g., above 600-700° C. However, at such temperatures currently available multilayer mirrors that form the collector such as collector 30 and other possible coating materials for the collector 240 lose their ability to effectively act as reflectors for light in the EUV range, and can even potentially destroys completely the reflectivity of all known multilayer mirrors.

It has also been suggested in at least one of the above referenced co-pending applications that an approach to deal with this problem: may be to maintain the collector at the lower temperature for evaporation of the plasma source material itself and to clean the collector of compounds of the plasma source material, e.g., lithium compounds, with, e.g., an RF plasma used for cleaning. this may be capacitive or inductively coupled to the collector, e.g., with helium or argon as a cleaning plasma formation gas and the collector may be RF biased to control energy of ions bombarding the collector to provide selectivity with, e.g., Li sputtering faster than Mo.

Sputtering with the plasma source material, e.g., Li sputtering, has also been proposed though the yield depends on the chemical form of lithium on a surface, e.g., oxides and carbonates of lithium are more difficult to sputter from the collector surface than the plasma source material, e.g., Li, itself.

According to aspects of an embodiment of the present invention applicants propose to use molecular or atomic hydrogen as a preliminary cleaning step. Hydrogen can be used, e.g., to react with the compounds of the plasma source material, e.g., lithium compounds, e.g., to form LiH and thereby removing the plasma source material from the plasma source material compound, e.g., the $Li_2O$ or $Li_2CO_3$ compounds. Applicants have determined that it is significantly easier to sputter Li out of the LiH rather than $Li_2O$ or $Li_2CO_3$.

According to aspects of an embodiment of the present invention applicants propose an additional way to extend the useful life of LPP and DPP EUV collector optics, which is beneficial in bringing down the cost of consumables, i.e., a new collector, and meeting the requirements for lifetime before replacement noted above. Along with the factors noted above, the lifetime of an LPP EUV collector may be limited by many factors, e.g., sputtering by energetic ions and neutrals from the EUV emitting plasma, oxidation of the surface layer, as well as the noted deposition of plasma source material. As noted in at least one of the above referenced co-pending applications, ruthenium has been suggested as a capping and/or sacrificial layer or material on the outer surface of the collector, including multilayer mirrors for a collector 30 or grazing-incident angle for a collector 240. Ruthenium has several advantages, e.g., it is reasonably EUV transparent, if used as an MLM reflector for collector 30. It is very difficult to oxidize, e.g., compared to Mo, Nb or Rh). It is difficult to sputter, compared, e.g., to Si and even Mo. Also it is the best material for grazing-incident collector 240 design, since it reflects at relatively higher grazing incidence angles. Other materials are also possible as selections for the capping layer for an MLM or for a reflective coating on a grazing incidence reflector for EUV.

However, if ruthenium, or some other material, is to be used, then the issue of wear of the Ru or other material needs to be addressed to improve EUW reflector lifetime and reduce cost of consumables. Use of Ru may be currently the most promising in and of its own materials properties, but still there remains a need to improve the lifetime of effectiveness of the material on either a normal angle of incidence collector (MLM capping layer) or on the grazing angle of incidence collector as a reflective surface to reach the targets for effective lifetime prior to replacement, which may be required to last for up to at least 100 billion pulses of EUV light (Plasma formations) for high volume manufacturing designs currently contemplated.

According to aspects of an embodiment of the present invention applicants propose the regeneration of the capping layer of an LPP EUV MLM collector or the reflectivity coating of an LPP or EUV grazing angle of incidence collector, e.g., a ruthenium capping layer or reflectivity coating, by the uniform re-growth of the capping layer or reflectivity coating layer, e.g., Ru, in-situ, e.g., by atomic layer deposition ("ALD"). Accordingly, as is noted in the first paragraph of Booyong, referenced above, the replacement of the capping layer material or reflectivity coating layer advantageously this can be done in-situ; the precursors exist and the process has been demonstrated; the deposition can be made uniform even for complex shapes, e.g., for an MLM or grazing incidence collector. In addition, the process if self-limiting, since saturation limit exists and the process is non-sensitive to exact proportions. Further the process is complementary, e.g., cycles can be repeated.

Those skilled in the art will appreciate that according to aspects of an embodiment of the present invention an apparatus and method for cleaning a plasma source material compound from a plasma produced EUV light source collector optic is disclosed which may comprise reacting the plasma source material compound with hydrogen to form a hydride of the plasma source material from the plasma source material contained in the plasma source material compound on the collector optic. Such hydrides of the plasma source material will be understood to be more easily removed from the surfaces of the EUV collector optic by various means than are the compounds of the plasma source material by such removal/cleaning means.

While the particular aspects of embodiment(s) of the EUV LIGHT SOURCE COLLECTOR LIFETIME IMPROVEMENTS described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present EUV LIGHT SOURCE COLLECTOR LIFETIME IMPROVEMENTS is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. In additions to changes and modifications to the disclosed and claimed aspects of embodiments of the present invention(s) noted above others could be implemented.

We claim:

1. A method of cleaning a plasma source material compound from a plasma produced EUV light source collector optic comprising:
    reacting the plasma source material compound with hydrogen to form a non-volatile hydride of the plasma source material from the plasma source material contained in the plasma source material compound on the collector optic; and
    removing the hydride from the collector by cleaning plasma action, plasma source material sputtering, or cleaning plasma action and plasma source material sputtering.

2. The method of claim 1 further comprising:
    initiating the reacting by introducing hydrogen into a plasma formation chamber containing the collector optic.

3. The method of claim 1 further comprising:
    removing the hydride from the collector optic.

4. The method of claim 2 further comprising:
    removing the hydride from the collector optic.

5. The method of claim 3 further comprising:
    the plasma source material comprises lithium and the plasma source material compound comprise a compound of lithium and oxygen, a compound of lithium and carbon, or a compound of lithium, oxygen and carbon.

6. The method of claim 4 further comprising:
    the plasma source material comprises lithium and the plasma source material compound comprise a compound of lithium and oxygen, a compound of lithium and carbon, or a compound of lithium, oxygen and carbon.

7. The method of claim 1 further comprising:
    the plasma source material comprises lithium and the plasma source material compound comprise a compound of lithium and oxygen, a compound of lithium and carbon, or a compound of lithium, oxygen and carbon.

8. A method of extending the useful life of a plasma produced EUV light source collector coating layer comprising:
    in situ replacement of the material of the coating layer by deposition of the coating layer material onto the coating layer.

9. The method of claim 8 further comprising:
    the deposition process has a saturation limit such that the process is non-sensitive to exact proportions.

10. The method of claim 8 further comprising:
    the deposition process is complementary such that cycles are repeatable.

11. The method of claim 9 further comprising:
    the deposition process is complementary such that cycles are repeatable.

12. The method of claim 8 further comprising:
    the material of the coating layer comprises ruthenium.

13. The method of claim 9 further comprising:
    the material of the coating layer comprises ruthenium.

14. The method of claim 10 further comprising:
    the material of the coating layer comprises ruthenium.

15. The method of claim 11 further comprising:
    the material of the coating layer comprises ruthenium.

16. The method of claim 8 further comprising:
    the deposition is carried out by atomic layer deposition.

17. The method of claim 9 further comprising:
the deposition is carried out by atomic layer deposition.
18. The method of claim 10 further comprising:
the deposition is carried out by atomic layer deposition.
19. The method of claim 11 further comprising:
the deposition is carried out by atomic layer deposition.
20. The method of claim 12 further comprising:
the deposition is carried out by atomic layer deposition.

21. The method of claim 13 further comprising:
the deposition is carried out by atomic layer deposition.
22. The method of claim 14 further comprising:
the deposition is carried out by atomic layer deposition.
23. The method of claim 15 further comprising:
the deposition is carried out by atomic layer deposition.
24. The method of claim 1, wherein the cleaning plasma action comprises an RF plasma used for cleaning.

* * * * *